United States Patent [19]

Pine

[11] 4,361,640
[45] Nov. 30, 1982

[54] AQUEOUS DEVELOPABLE PHOTOPOLYMER COMPOSITIONS CONTAINING TERPOLYMER BINDER

[75] Inventor: Herbert J. Pine, Edison, N.J.

[73] Assignee: E. I. Du Pont de Nemours and Company, Wilmington, Del.

[21] Appl. No.: 308,056

[22] Filed: Oct. 2, 1981

[51] Int. Cl.$^3$ .............................................. G03C 1/68
[52] U.S. Cl. ................... 430/275; 430/281; 430/286; 430/288; 430/906; 430/908; 430/910
[58] Field of Search ............... 430/906, 908, 281, 286, 430/288, 910, 275

[56] References Cited

U.S. PATENT DOCUMENTS 3,804,631  4/1974  Faust .................................... 430/281
4,019,972  4/1977  Faust .................................... 430/908
4,189,322  2/1980  Hoffmann et al. ................... 430/281

Primary Examiner—Won H. Louie, Jr.

[57] ABSTRACT

Compatible, aqueous developable photopolymerizable composition consisting essentially of (a) 22 to 32% by wt. of a monomeric compound having at least two terminal ethylenic groups, (b) 0.1 to 5.0% by wt of a photoinitiator or initiator system, (c) 40 to 80% by wt of a binder system which is the reaction product of (1) 65 to 87 parts by wt of a terpolymer of methylmethacrylate, butylmethacrylate and methacrylic acid as defined, (2) 5 to 20 parts by wt of a polyamide resin and (3) 5 to 20 parts by wt of a copolymer of vinyl pyrrolidone and vinyl acetate, (d) 0.03 to 0.10% by wt of a thermal polymerization inhibitor, and optionally up to 18% by wt of a plasticizer and up to 2.0% by wt of a tertiary amine capable of salt formation with a carboxylic acid. Aqueous developable photopolymerizable elements comprise a support bearing a layer of the composition. Relief printing plates can be prepared by imagewise exposing and developing the elements.

13 Claims, No Drawings

AQUEOUS DEVELOPABLE PHOTOPOLYMER COMPOSITIONS CONTAINING TERPOLYMER BINDER

BACKGROUND OF THE INVENTION

Description

Technical Field

This invention relates to photopolymerizable compositions. More particularly, this invention relates to photopolymerizable compositions which are developable under aqueous conditions. This invention also relates to photopolymerizable elements prepared from the photopolymerizable compositions and to an extrusion process for preparing the elements.

Background Art

Photopolymerizable compositions are known to those skilled in the art. These compositions have many uses, e.g., in the preparation of printing plates for various printing uses such as letterpress, flexographic, dry offset, etc., photoresists, etc. Of particular interest are the photopolymerizable compositions which are soluble in aqueous solutions. One such aqueous soluble photopolymerizable composition which contains an acidic cellulose derivative as the polymeric binder is disclosed in U.S. Pat. No. 2,927,022. The compositions containing the acidic cellulose derivatives are processable to film or layer form from solution or by conventional mechanical means, e.g., extruding, calendering, etc., with or without added plasticizers. Cellulose hydroacetate, one monomer from which the acidic cellulose derivatives are obtained, is difficult to prepare and use. U.S. Pat. Nos. 2,923,673 and 3,012,952 describe procedures which enable the preparation of good quality photopolymerizable compositions containing cellulose derivatives. Photopolymerizable elements prepared from compositions containing cellulose derivatives have the disadvantage that they are rather slow photographically, i.e., they require correspondingly long imagewise exposures to actinic radiation. The radiation sources used for the exposure generate heat sufficient to cause the art work used during an imagewise exposure to adhere to the photopolymerizable layer. To prevent heat buildup the exposure generally is conducted in short increments of time with cooling occurring between successive exposure increments. It is desirable to prepare photopolymerizable compositions which not only have good quality but have environmental advantages at reduced mill costs over prior art compositions. It is also desirable to prepare photopolymerizable elements which possess improved photographic speed which can be exposed imagewise by a single exposure.

DISCLOSURE OF INVENTION

In accordance with this invention, there is provided a compatible, aqueous developable photopolymerizable composition consisting essentially of
  (a) 22 to 32% by weight of an ethylenically unsaturated monomeric compound having at least two terminal ethylenic groups capable of forming a high polymer by free-radical initiated chain-propagated addition polymerization;
  (b) 0.1 to 5.0% by weight of a free radical generating, addition polymerization initiator or initiator system activatable by actinic radiation;
  (c) 40 to 80% by weight of a binder system which is the reaction product of
    (1) 65 to 87 parts by weight of a terpolymer of methylmethacrylate, butylmethacrylate, and methacrylic acid, the terpolymer having an acid number of 175 to 200 and an inherent viscosity of about 0.4 to 0.5,
    (2) 5 to 20 parts by weight of amine-terminated polyamide resin, and
    (3) 5 to 20 parts by weight of a copolymer of vinyl pyrrolidone and vinyl acetate;
  (d) 0.03 to 0.10% by weight of a thermal polymerization inhibitor;
  (e) 0 to 18% by weight of a plasticizer for the composition; and
  (f) 0 to 2% by weight of a tertiary amine capable of salt formation with a carboxylic acid, the percentages of the composition components being based on the total weight of the composition.

In accordance with an embodiment of this invention, there is provided an aqueous developable photopolymerizable element which comprises a support bearing a layer, 0.0005 to 0.250 inch (0.00127 to 0.635 cm) of the above-described photopolymerizable composition.

The compatible, aqueous developable photopolymerizable compositions of the invention contain as required ingredients: addition polymerizable ethylenically unsaturated monomeric compounds having at least two terminal ethylenic groups (a), free radical generating addition polymerization initiator or initiator system (b), polymeric binder system (c), and thermal polymerization inhibitor (d). Preferably a plasticizer (e) for the composition and optionally a tertiary amine capable of salt formation with a carboxylic acid (f) are present in the composition. By "compatible" is meant the ability of two or more constituents to remain dispersed in one another without causing any significant amount of scattering of actinic radiation. Compatibility is often limited by the relative proportions of the constituents, and incompatibility is evidenced by formation of haze and "bleeding" or "blooming" of components in the photosensitive composition. Some slight haze can be tolerated from such compositions before or during exposure in the preparation of printing reliefs, but when fine detail is desired, haze should be completely avoided, and bleeding or blooming should not occur at any time. The amount of ethylenically unsaturated compound, or any other constituent, used is therefore limited to those concentrations which do not produce these undesired effects.

The addition polymerizable ethylenically unsaturated monomeric compounds (a) having at least two terminal ethylenic groups useful in this invention include: tetraethylene glycol diacrylate (preferred), triethylene glycol diacrylate, triethylene glycol dimethacrylate, hexamethylene glycol diacrylate, trimethylolpropane triacrylate, ethylene glycol diacrylate, diethylene glycol diacrylate, tetramethylene glycol diacrylate, polyethylene glycol diacrylate, with an average molecular weight of the glycol ranging from 200 to 600, ethylene glycol dimethacrylate, diethylene glycol dimethacrylate, tetramethylene glycol dimethacrylate, 1,3-propanediol dimethacrylate, 1,2,4-butanetriol trimethacrylate, 1,4-cyclohexanediol diacrylate, 1,4-benzenediol dimethacrylate, 1,2-benzenedimethanol diacrylate, glycerol triacrylate, trimetholol propane triacrylate, pentaerythritol triacrylate, pentaerythritol tetramethacrylate, 1,3-propanediol diacrylate, 1,3-pentanediol dimethacrylate, 1,4-butanediol diacrylate, 2,2-dimethylolpropane diacrylate, tripropylene glycol diacrylate, 2,2-di(p-hydroxyphenyl)propane diacrylate, 2,2-di(p-hydroxyphenyl)propane dimethacrylate, polyoxyethyl-2,2-di(p-hydroxyphenyl)propane dimethacrylate, polyoxyethyl-2,2-di(p-hydroxyphenyl) propane triacrylate, 1,4-butanediol dimethacrylate, hexamethylene glycol dimethacrylate, 2,2,4-trimethyl-1,3-pentanediol dimethacrylate, 1-phenylethylene-1,2-dimethacrylate, trimethylolpropane trimethacrylate, polyoxyethyltrimethylolpropane triacrylate, diacrylate and dimethacrylate esters of diepoxy polyethers derived from aromatic polyhydroxy compounds such as bisphenols, novolaks and similar compounds such as those described by Crary in U.S. Pat. No. 3,661,576, which is incorporated by reference, the bis-acrylates and methacrylates of polyethylene glycols of molecular weight 200–500, etc. The monomers are present in an amount of 22 to 32% by weight based on the total weight of the composition, preferably 26 to 28% by weight.

The required addition polymerization initiator or initiator system (b) includes: benzil type compounds, e.g., benzil, benzil monodimethyl ketal, benzil monomethyl ethyl ketal, benzil monomethyl benzyl ketal, benzil mononeopentyl ketal, etc.; acetophenones, e.g., 2,2-dimethoxy-2-phenyl acetophenone, etc.; biimidazolyl dimers; quinone type compounds such as are disclosed in U.S. Pat. No. 2,951,758, e.g., 9,10-anthraquinone, 1-chloroanthraquinone, 2-chloroanthraquinone, 2-methylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz[a]anthracene-7,12-dione, ethyl anthraquinone, etc. The initiator is present in an amount of 0.1 to 5.0% by weight based on the total weight of the composition, preferably 1.0 to 1.4% by weight.

The useful binder system (c) of this invention is a reaction product of three polymer components. Polymer component (1) is a terpolymer of methyl methacrylate (27 to 31%, preferably 29%)/n-butylmethacrylate (40 to 45%, preferably 42 or 43%)/methacrylic acid (26 to 32%, preferably 28% to 30%). The terpolymer has an acid number in the range of about 175 to 200 and an inherent viscosity of about 0.4 to 0.5. Polymer component (2) is an amine terminated polyamide resin, e.g., of the 6 (81.3%)/66 (0.7%)/610 (18.0%) type having a melting point of 145°–150° C. (this resin is generally present with 3 to 18% by weight of a plasticizer, preferably 15% by weight; or the 6 (5 to 10%)/66 (20 to 30%)/12 (60 to 70%) type having a melting point of 120°–130° C. which is preferred. The polyamide codes of the resins are: 6 is polycaprolactam, 12 is poly-omega laurolactam, 66 is polyhexamethylenediamine adipate, and 610 is polydecamethylenediamine adipate. Polymer component (3) is a copolymer of vinyl pyrrolidone (60%) and vinyl acetate (40%). All the above values in this paragraph are weight percent. Component (1) is present in the binder in amounts of 65 to 87% by weight, preferably 70 to 75% by weight; component (2) is present in amounts of 5 to 20% by weight, preferably 12 to 18% by weight, and component (3) is present in amounts of 5 to 20% by weight, preferably 9 to 13% by weight, all based on the total weight of the binder component. Based on the total weight of photopolymerizable composition, the binder is present in a range of 40 to 80% by weight, preferably 60 to 65% by weight.

Suitable thermal polymerization inhibitors present in the photopolymerizable compositions include: 1,4,4-trimethyl-2,5-diazobicyclo[3.2.2]-non-2-ene-N,N'-dioxide (preferred) as well as p-methoxyphenol, hydroquinone, alkyl and aryl-substituted hydroquinones, tert-butyl catechol, pyrogallol, naphthylamines, β-naphthol, p-benzoquinone, 2,6-di-tert-butyl-p-cresol, dicyclopentadienyliron, phenothiazine, pyridine, nitrobenzene, dinitrobenzene, p-toluquinone, chloranil, and thiazine dyes, e.g., thionine, thionine blue G, methylene blue B and toluidine blue O, etc. The thermal polymerization inhibitor is present in the composition in 0.03 to 0.10% by weight based on the total weight of the composition, preferably 0.05 to 0.07% by weight.

Optionally a plasticizer for the composition can be present in amounts of 0 to 18% by weight, preferably 6 to 15%, most preferably 9% by weight based on the weight of composition. Useful plasticizers include well known solid types such as triphenyl phosphate, glyceroltriacetate (triacetin), glyceroltributyrate, triethylene glycol diproprionate, dimethyl phthalate, mixed o,p-toluene sulfonamides, etc.

Another optional component is a tertiary amine capable of salt formation with a carboxylic acid. When present this component is present in an amount of 0 to 2% by weight based on the total weight of the composition, preferably 0.5 to 1.5% by weight, if present. Suitable tertiary amines include: diethylcyclohexylamine (preferred), triethylenediamine, pyridine, triethylamine, tributylamine, triamylamine, trimethylamine acetate, pyridine acetate, etc.

Additional optional additives include: dyes, preferably window dyes, pigments, fillers, etc.

The above ingredients can be mixed in a twinscrew extruder device as described below and the composition formed extruded into the nip of a calender. The extruded composition is calendered between two surfaces, i.e., a support and a cover sheet. The calender nip is adjustable to provide variations in layer thickness, e.g., 0.010 to 0.250 inch (0.254 to 6.35 mm). Layers within this range of thickness will be used for the majority of the printing plates. Thinner layers, e.g., to a thickness of at least 0.0005 inch (0.0127 mm) can be provided by known coating techniques using suitable solvents and standard coating equipment. The laminated photopolymer element formed is cooled, e.g., by blowing with cool air, etc., and is cut into a desired size. Suitable supports include: metal and polymer film supports. Suitable metal supports are copper, aluminum, steel, tin-plated steel, chrome-plated steel, chromate-treated aluminum, copper plated aluminum, etc. The metal supports generally have a thickness in the range of 0.001 to 0.100 inch (0.025 to 2.5 mm). Suitable film supports are polyethylene terephthalate, flame-treated polyethylene terephthalate, electron-discharge treated polyethylene terephthalate, etc. which can be coated with a suitable adhesive or subbing layer. Removable cover sheets useful to protect the photopolymer surface of the element include: polyethylene terephthalate which may be sub-treated and gelatin coated, and other known cover sheets.

Printing reliefs can be made in accordance with this invention by exposing to actinic radiation selected portions of a photopolymer layer of an element described above, for example, through a process transparency, i.e., an image-bearing transparency or stencil having areas substantially transparent to actinic radiation and of substantially uniform optical density and of areas opaque to actinic radiation and of substantially uniform optical density until substantial addition-polymerization takes place. The image areas can be comprised of halftone dots. During the addition-polymerization, the ethylenically unsaturated compound is converted to the insoluble state in the radiation-exposed portions of the layer, with no significant polymerization taking place in the unexposed portions or areas of the layer. The unexposed portions of the layer are removed by means of an aqueous alkaline solution, e.g., 0.01 to 0.2 N, preferably 0.04 N sodium hydroxide solution, as well as other alkali metal hydroxides, e.g., lithium and potassium hydroxide; the base-reacting alkali metal salts of weak acids, e.g., lithium, sodium, and potassium carbonates and bicarbonates; ammonium hydroxide and tetra-substituted ammonium hydroxides, e.g., tetramethyl-, tetraethyl-, trimethylbenzyl-, and trimethylphenylammonium hydroxides, sulfonium hydroxides, e.g., trimethyl-, diethylmethyl, dimethylbenzyl-, sulfonium hydroxides, and the basic soluble salts thereof, e.g., the carbonates, bicarbonates and sulfides; alkali metal phosphates and pyrophosphates, e.g., sodium and potassium triphosphates and sodium and potassium pyrophosphates; tetra-substituted (preferably wholly alkyl) phosphonium, arsonium, and stibonium hydroxide, e.g., tetramethylphosphonium hydroxide. The process transparency may be prepared from any suitable material including oriented polyester film, cellulose acetate film, etc.

Actinic radiation from any source and of any type can be used in the photopolymerization process. The radiation may emanate from point sources or be in the form of parallel rays or divergent beams. By using a broad radiation source relatively close to the image-bearing transparency, the radiation passing through the clear areas of the transparency enters as divergent beams and thus irradiates a continually diverging area in the photosensitive layer underneath the clear portions of the transparency. This results in a polymeric relief having its greatest width at the bottom of the photosensitive layer, i.e., a frustum, the top surface of the relief being approximately the dimensions of the clear area.

Inasmuch as the free-radical generating systems activatable by actinic radiation generally exhibit their maximum sensitivity in the ultraviolet range, the radiation source should furnish an effective amount of this radiation, preferably having a wavelength range between about 2500 Å and 5000 Å. Suitable sources of such radiation, in addition to sunlight, include carbon arcs, mercury-vapor arcs, fluorescent lamps with ultraviolet radiation-emitting phosphors, argon glow lamps, electron flash units and photographic flood lamps. Of these, the mercury-vapor lamps, particularly the sun lamp or "black light" type, and the fluorescent sun lamps, are most suitable. Electron accelerators and electron beam sources through an appropriate mask may also be used.

The radiation exposure time may vary from fractions of a second to minutes, depending upon the intensity and spectral energy distribution of the radiation source, its distance from the composition and the nature and amount of the composition available. Customarily, a mercury vapor arc or a sunlamp is used at a distance of about 1.5 to about 60 inches (3.8 to 153 cm) from the photosensitive composition. Exposure temperatures are not particularly critical, but it is preferred to operate at about ambient temperatures or slightly higher, i.e., about 20° to about 35° C.

Solvent development may be carried out at about 25° C., but best results are sometimes obtained when the solvent is warm, e.g., 30° to 60° C. Development time can be varied but preferably is in the range of 5 to 25 minutes.

In the development step where the relief is formed, the solvent may be applied in any convenient manner, as by pouring, immersion, spraying, or roller application. Brushing aids in the removal of the unpolymerized or uncrosslinked portions of the composition.

After liquid development the plate is dried, e.g., by placing in front of a fan, optionally in hot air, to a temperature of about 20° (room temperature) to 25° C. for 0.75 to 8 hours for maximum strength.

BEST MODE FOR CARRYING OUT THE INVENTION

The best mode is illustrated in Example 1.

INDUSTRIAL APPLICABILITY

The aqueous developable photopolymerizable compositions are useful in the preparation of photopolymerizable elements which upon imagewise exposure and aqueous development result in printing plates. The printing plates which are long wearing and flexible are useful in many types of printing but particularly for dry offset, relief or letterpress printing plates. The printing plates are produced by a less expensive and more ecologically sound method. The new printing plates also do not require photoconditioning prior to use.

EXAMPLES

The invention is illustrated by the following examples wherein the parts and percentages are by weight. The polymeric molecular weights are expressed as number average molecular weights ($\overline{M}n$). The $\overline{M}n$ for the polymers described herein can be determined by gel permeation chromatography employing a polybutadiene standard or other standard known to those skilled in the art.

The following screening procedure is utilized to determine whether a particular photopolymerizable composition is of proper quality. The procedure describes the preparation of photopolymerizable compositions (A), the preparation of photopolymerizable elements utilizing the compositions (B), and the preparation of exposed and developed elements (C) and their evaluation for specified properties as set forth below.

SCREENING PROCEDURE

A. Preparation of Photopolymerizable Compositions

The three components making up the binder system are weighed together, as are the other ingredients of the photopolymerizable composition, e.g., monomer, initiator, inhibitor, plasticizer, etc. The mixtures are blended, e.g., on a two roll rubber mill (3 inch by 8 inch rolls, 7.62 cm by 20.32 cm), for 5 to 7 minutes at 150° to 160° C. roll temperature. A significant melt toughening is observed as the binder components react with one another. After milling, the mill is cooled and the composition is removed from the mill as a slab. The slab is weighed to determine the percentage yield, e.g., generally about 95%.

B. Preparation of Photopolymerizable Elements

The slab prepared in A above is pressed between an adhesive-coated metal support and an 0.004 inch (0.102 mm) polyethylene terephthalate cover sheet in an 0.030 inch (0.762 mm) mold at 145° C. and the ram pressure conditions indicated below in a Dake 25 ton (25,410 kg) Laboratory Press with steam heated platens, Model 44-069, or similar type hydraulic press.

Cycle:
- 2 minutes warm up in press
- 1 minute at 10,000 lbs (4535.9 kg)
- 1 minute at 20,000 lbs (9071.8 kg)
- 1 minute at 30,000 lbs (13,607.7 kg) cool under pressure to room temperature and release pressure The unexposed element is tested for washout or development rate in 0.04 N aqueous NaOH solution at 85° F. (29° C.) in a washout machine, e.g., Du Pont ® Master Flat Plate Washout apparatus or Dycril ® Hi Speed Rotary Washout apparatus, E. I. du Pont de Nemours and Company, Wilmington, Del. Element thickness is determined micrometrically before and after one minute washout and subsequent drying, and the difference is taken as the washout rate. The washed out areas are examined visually and by touch for the presence of "grit" or roughness of finish which is an indication of inhomogeneity of the photopolymer matrix. In addition, a separate unexposed element is washed out to complete removal of unexposed photopolymer matrix from the support, and the time is recorded.

C. Preparation of Exposed and Developed Elements (1) Photoconditioning

Photoconditioning is preferred to prevent inhibition of the photoreaction by oxygen diffusing into the element. An unexposed element prepared as described in B above with the cover sheet removed is placed in a flat-bed exposure unit, e.g., Du Pont ® Flat Blacklight Exposure Unit, E. I. du Pont de Nemours and Company, Wilmington, Del. under a Krene ® (polyvinyl chloride) cover sheet and a polyvinyl fluoride film filter and is exposed to actinic radiation from a bank of 18 Sylvania VHO tubes 2 inches (5.08 cm) from the surface. An opaque mask covers a 2-inch (5.08 cm) strip of the element during a 20 second initial exposure and is advanced 1 to 1.5 inches (2.54 to 3.81 cm) for each succeeding five-second exposure increment to a total of twelve. The exposed element is washed out for the time found under B above and is dried. The photoconditioning time is taken to be about 50% of the minimum exposure time giving complete polymerization through the layer in the corresponding exposure step area.

Following the photoconditioning exposure set forth above, within 2 minutes the element is exposed through a sensitometric test negative, matte side down, and the Krene ® (polyvinyl chloride) cover sheet under 15 inches vacuum (38.1 cm mercury). Exposures of one minute through 3½ minutes at ¼ minute intervals are performed on the test element. The element is then removed from the exposure device, is washed out for the time noted above, is dried, is examined with a 10x glass, and the minimum exposure yielding an acceptable 0.012 inch (0.305 mm) isolated dot, i.e., minimal to zero undercutting, and good 5 percent (120 line screen) highlight dots is determined. This is the smallest acceptable exposure (SAE).

The exposed, developed and finished elements are evaluated with respect to the following properties as appropriate.

1. Knoop hardness: ASTM-D1474-69, Method A
2. Photospeed: (SAE)
3. Image quality: Shadow well depths and image element profiles
4. Flexibility: under conditions of 5% relative humidity
5. Wear resistance of printing reliefs: Taber Abraser Knoop hardness values, 1 above, are determined by ASTM-D1474-69, Method A. Photospeed, 2 above, is determined as noted above (SAE). Image quality of printing reliefs, 3 above, includes both qualitative and quantitative evaluation. The image profiles of the exposed and developed elements are judged subjectively with respect to correct frustum shape. Shadow well depths are measured microscopically using a Zeiss Opton ® interference microscope fitted with a distance scale on the focusing dial. The difference in readings when interference fringes appear in the microscope focused on the printing surface and focused on the bottom surface of the shadow well is the shadow well depth. Flexibility at low relative humidity, 4 above, is determined as follows: a photopolymer element is given an overall uniform SAE exposure using an ultraviolet blacklite source. The exposed element is given a 5-minute washout using 0.04 N aqueous NaOH at 85° F. (30° C.), is rinsed with water and is dried in air at ambient temperature for 10 minutes. The element is transferred to a low humidity room (5 to 15% RH/70° to 75° F. (21° to 24° C.) for storage. Testing of the element is accomplished after 1 hour and 24 hours at the low humidity. The sample is placed in a bending jig and is bent until fracture occurs or the bending limit of 100 degrees deflection is reached. A suitable testing device is a Tabor Stiffness Tester modified to withstand the stresses imposed in testing metal-supported plates. The larger the angle through which bending without fracture occurs, the better the plate quality.

The wear resistance of printing reliefs, 5 above, is determined as follows: a dried, exposed developed element prepared as described in test 4 above is placed in a small pan of Varntine ® solvent (mineral spirits sold by Varn Products Co., Oakland, N.J.) on the sample holder of a Taber Abraser fitted with a 500 g counterweight and a H-38 wheel. The sample is abraded for 45 minutes at room temperature, is removed from the solvent bath, is blotted dry, and is measured for abrasion loss with a micrometer.

In Example 1, the photopolymerizable composition is prepared by means of a Werner and Pfleiderer 83 mm co-rotating intermeshed twin screw compounding extruder, model ZSK 83, configured and operating as set forth below and in Table 1:157 to 160° C. melt temperature, 150 to 190 rpm screw speed, and 200 to 300 pounds (90 to 136 kg)/hour delivery rate.

TABLE 1

| Barrel[1] No. | Temp °C. | Screw Bushing[2] | | | Screw Running Length (mm) |
| --- | --- | --- | --- | --- | --- |
| | | Lead[2a] | Length[2b] | Designation[2c] | |
| 1 | RT < T ≦ 100 | 120 | 120 | SK$_3$-RH$_4$ | 120 |
| | | 120 | 120 | SK-RH | 240 |
| 2 | 95–113 | 120 | 40 | SK-N | 280 |
| | | 120 | 120 | RH | 400 |
| | | 90 | 30 | RH | 430 |
| 3 | 95–113 | 75 | 150 | RH | 580 |

TABLE 1-continued

| Barrel[1] No. | Temp °C. | Screw Bushing[2] Lead[2a] | Screw Bushing[2] Length[2b] | Screw Bushing[2] Designation[2c] | Screw Running Length (mm) |
|---|---|---|---|---|---|
|  |  | 75 | 150 | RH | 730 |
| 4 | 95–113 | 75 | 75 | RH | 805 |
|  |  | 75 | 25 | RH | 830 |
|  |  | 75 | 25 | RH | 855 |
|  |  | KB[6] | 30 | RH | 885 |
|  |  | KB | 45 | N[7] | 930 |
|  |  | KB | 30 | LH[8] | 960 |
|  |  | KB | 45 | N | 1005 |
| 5 | 95–113 | KB | 45 | N | 1050 |
|  |  | KB | 30 | RH | 1080 |
|  |  | KB | 45 | N | 1125 |
|  |  | KB | 45 | N | 1170 |
|  |  | 75 | 25 | LH | 1195 |
|  |  | 75 | 25 | LH | 1220 |
| 6 | 79 | 120 | 120 | RH | 1340 |
|  |  | 120 | 120 | RH | 1460 |
| 7 | 94 | 90 | 90 | RH | 1550 |
|  |  | 75 | 150 | RH | 1700 |
| 8 | 94 | 75 | 150 | RH | 1850 |
|  |  | 75 | 75 | RH | 1925 |
|  |  | 75 | 75 | RH | 2000 |
|  |  | 60 | 20 | RH | 2020 |
|  |  | 60 | 20 | RH | 2040 |

Input and Removal Locations: The three solids input occur between 60 and 180 mm; the fluid input port is located between 280 and 400 mm; and vapor is removed under vacuum at about 1280 mm, all values are expressed in screw running length.
[1] Housing building block for extruder screw.
[2] Extruder screw building block.
[2a] Screw length in mm for 360° rotation.
[2b] Actual length of the element in mm.
[2c] Manufacturer's element code.
[3] SK is undercut.
[4] RH is right-handed.
[5] Transition from undercut to regular screw.
[6] KB is kneading block.
[7] Transition element from RH ⟷ LH.
[8] LH is left handed.

EXAMPLE 1

A photopolymerizable composition is prepared as follows:

The following three solid ingredients are fed by three separate feeders simultaneously into the solids input port of a Werner and Pfleiderer 83 mm co-rotating twin screw intermeshed compounding extruder.

| Ingredient | Amount (%) |
|---|---|
| Terpolymer of methylmethacrylate (29) n-butylmethacrylate (43)/methacrylic acid (28) having an acid no. of 175–200 and an inherent viscosity of ca. 0.4 to 0.5 | 45.74 |
| Amine-terminated polyamide resin (6/66/12) (5–10/20–30/60–70), melting point of 120 to 130 C. | 10.00 |
| Copolymer of vinyl pyrolidone (60)/ and vinyl acetate (40) | 7.00 |

The following substantially liquid ingredients after being mixed together, are added through the liquid input port of the extruder simultaneously with the above solids.

| Ingredient | Amount (%) |
|---|---|
| Tetraethylene glycol diacrylate | 27.00 |
| Triphenyl phosphate | 9.00 |
| 2,2-Dimethoxy-2-phenyl acetophenone | 1.20 |
| 1,4,4-Trimethyl-2,5-diazobicyclo- [3.2.2]-non-2-ene-N,N'—dioxide | 0.06 |

The extruder performs the functions of melting, premixing, homogenizing, devolatilizing and filtering the composition before delivery at 155° to 175° C. to the extrusion die. The extruded composition enters the rotating bank of a two roll calender, 16 inches by 48 inches (40.64 by 121.92 cm), and is calendered between the coated side of an electrolytic tin plate support, 0.012 inch (0.305 mm) in thickness and the release side of a polyethylene terephthalate cover sheet having a subbing layer as described in U.S. Pat. No. 2,627,088 Example IV and a gelatin layer, 0.007 inch (0.18 mm) in thickness. The coated side of the tin plate support contains in succession a primer coating comprising an epoxy-urea formaldehyde resin and a red iron oxide pigment; an adhesive layer comprising an isocyanate-modified copolyester; and a barrier and anchor layer to improve adhesion and prevent or inhibit monomer migration and comprising a composition similar to the photosensitive composition but with benzoyl peroxide replacing the photoinitiator. The coatings are successively applied to the metal support and cured by commercial coil coating techniques known to those skilled in the art. The calender nip can be adjusted to produce variations in layer thickness which in this instance is 0.030 inch (0.762 mm) thick. The laminated element is cooled with blown air and is cut to the desired size.

The element is placed in a Du Pont Flat Blacklight Exposure Unit, E. I. du Pont de Nemours and Company, Wilmington, Del., over which is placed a 0.001 inch (0.254 mm) thick polyvinyl fluoride film filter and is exposed for 1 to 2 minutes through an image containing halftone dots and highlights to actinic radiation from a bank of 20 Sylvania VHO 65 watt tubes 2 inches (5.08 cm) from the surface. The exposed element is removed from the exposure device and is placed in a washout developer device described in the Screening Procedure above, and is developed for 5 minutes using a 0.04 N aqueous NaOH solution at 85° F. (29° C.). A good quality relief printing plate having the properties set forth in Table 2 is achieved.

TABLE 2

| | Test | Result |
|---|---|---|
| 1. | Photosensitization | |
|  | (a) Exposure time (sec.) | 25.0 |
| 2. | Photoimaging exposure | |
|  | Photosensitized (min.) | 1.0 |
|  | Nonphotosensitized (min.) | 2.0 |
| 3. | Washout time (min.) | 5.5 |
| 4. | Flatness | Good; no round edges |
| 5. | Adhesion | |
|  | 100 to 2000 M impressions | Good |
| 6. | Print quality Good | |
| 7. | Devlopment rate | |
|  | inch/min. (mm/min.) | 0.005 (0.127) |
| 8. | Reverse dot well, inch (mm) | 0.00241 (0.0612) |
| 9. | Wear, inch (mm) | 0.0043 (0.011) |
| 10. | Flexibility | No break at 100 degrees deflection |

EXAMPLE 2

Three printing plates, A, B and C, having the ingredients described in Table 3 below are prepared according to the Screening Procedure.

TABLE 3

| Ingredient | Samples (Parts) | | |
|---|---|---|---|
| | A | B | C |
| Terpolymer of methylmethacrylate (28.5)/n-butylacrylate (42)/methacrylic acid (29.5) having an acid no. of 175-200 and an inherent viscosity of ca. 0.4 to 0.5 | 42.74 | — | — |
| Terpolymer described in Example 1 | — | 45.74 | — |
| Amine-terminated polyamide as described in Example 1 | 10.0 | 10.0 | — |
| Poly[vinyl pyrrolidone (60)/vinyl acetate (40)] | 7.0 | 7.0 | — |
| Cellulose acetate succinate | — | — | 50.93 |
| Cellulose acetate | — | — | 9.67 |
| Tetraethyleneglycol diacrylate | 23.0 | 27.0 | — |
| Triethyleneglycol diacrylate | — | — | 24.73 |
| Triphenyl phosphate | 16.0 | 9.0 | — |
| Tributoxyethyl phosphate | — | — | 12.89 |
| 2,2-Dimethoxy-2-phenyl acetophenone | 1.2 | 1.2 | — |
| 2-Ethylanthraquinone | — | — | 0.10 |
| 1,4,4-Trimethyl-2,5-diazobicyclo-[3.2.2]-non-2-ene-N,N'—dioxide | 0.03 | 0.06 | — |
| Hydroquinonemonomethyl ether | — | — | 0.20 |
| Diethylcyclohexylamine | — | — | 1.48 |

Elements A and C are tested according to the procedures described above with the results shown in Table 4 being achieved.

TABLE 4

| Test | | Samples | |
|---|---|---|---|
| | | A | C |
| 1. | Flexibility | No break | No break |
| 2. | Wear, inch | 0.00043 ± 0.00013 | 0.00053 ± 0.0001 |
| | mm | 0.0109 ± 0.0033 | 0.01346 ± 0.00254 |
| 3. | Reverse Dot Depth, 0.005 | | |
| | inch/ | 0.00241 | 0.00227 |
| | 0.127 mm | 0.0612 | 0.0577 |
| 4. | Grit | None | Trace |

The printing plate of the invention (A) has less wear, improved large dot retention, and absence of grit while it is at least equal in flexibility to the prior art printing plate (C).

Printing plate B is compared to printing plate C is press tests. The comparative results are set forth in Table 5.

TABLE 5

| Characteristic | | Samples | |
|---|---|---|---|
| | | B | C |
| 1. | Photsensitization | | |
| | (a) Exposure time (sec.) | 25.0 | 90.0 |
| | (b) Relative speed | 3.6 | 1.0 |
| 2. | Photoimaging exposure | | |
| | Photosensitized (min.) | 1.0 | 4.0 |
| | Nonphotosensitized (min.) | 2.0 | 10.0 |
| 3. | Relative imaging speed | | |
| | Photosensitized | 4.0 | 1.0 |
| | Nonphotosensitized | 5.0 | 1.0 |
| 4. | Washout | | |
| | Time (min.) | 5.5 | 7.5 |
| | Relative rate | ca. 1.4 | 1.0 |
| 5. | Flatness | Good | Edges |
| 6. | Adhesion | Good | Rounded Good |
| 7. | 172[1]-250[2]M impressions Print Quality | Good | Good |

[1]General Web Dynamics, 2-color Webaligner at 1500 feet/min. (457.2 m/min.)
[2]Hamilton Web, 3-color Press The printing plate of the invention is superior to the prior art printing plate in its photosensitization time, photoimaging time, washout time, flatness and is at least equal in adhesion to the support and print quality.

EXAMPLE 3

This example illustrates the superiority of photopolymerizable compositions containing the three component binder system of the invention over those containing two-component and single-component binders. Three printing plates, A, B and C, having the ingredients described in Table 6 below are prepared according to the Screening Procedure.

TABLE 6

| Ingredient | Samples (%) | | | |
|---|---|---|---|---|
| | A | B | C | D |
| Terpolymer described in Example 2 | 45.74 | 52.74 | 55.74 | 55.10 |
| Amine-terminated polyamide described in Example 1 | 10.0 | 10.0 | — | — |
| Poly[vinyl pyrrolidone (60)/vinyl acetate (40)] | 7.0 | — | 7.0 | — |
| Tetraethyleneglycol diacrylate | 27.0 | 27.0 | 27.0 | 32.526 |
| Triphenyl phosphate | 9.0 | 9.0 | 9.0 | 10.842 |
| 2,2-Dimethoxy-2-phenyl acetophenone | 1.2 | 1.2 | 1.2 | 1.445 |
| 1,4,4-Trimethyl-2,5-diazo-bicyclo[3.2.2]-non-2-ene-N,N'—dioxide | 0.06 | 0.06 | 0.06 | 0.007 |

The elements are tested according to the Screening Procedures and achieve the results shown in Table 7. No element is made from Sample D since the composition does not homogenize on the rubber mill and falls off.

TABLE 7

| Test | Samples | | |
|---|---|---|---|
| | A | B | C |
| Development rate inch/min. | 0.0057 | 0.0041 | 0.004 |
| (mm/min.) | (0.145) | (0.104) | (0.102) |
| Reverse dot well, inch (mm) | 0.00235 | 0.00033 | 0.00218 |
| | (0.0597) | (0.0084) | (0.0554) |
| Wear, inch (mm) | 0.00032 | 0.00037 | 0.00072 |
| | (0.0081) | (0.0094) | (0.0183) |
| Flexibility (°) | 82.0 | 60.0 | 56.0 |

Sample A, which illustrates the invention, is superior with respect to development rate, reverse dot well rendition, wear, and flexibility over printing plates B and C.

I claim:

1. A compatible, aqueous developable photopolymerizable composition consisting essentially of
   (a) 22 to 32% by weight of an ethylenically unsaturated monomeric compound having at least two terminal ethylenic groups capable of forming a high polymer by free-radical initiated chain-propagated addition polymerization;
   (b) 0.1 to 5.0% by weight of a free radical generating, addition polymerization initiator or initiator system activatable by actinic radiation;
   (c) 40 to 80% by weight of a binder system which is the reaction product of
      (1) 65 to 87 parts by weight of a terpolymer of methylmethacrylate, butylmethacrylate, and methacrylic acid, the terpolymer having an acid number of 175 to 200 and an inherent viscosity of about 0.4 to 0.5,
      (2) 5 to 20 parts by weight of amine-terminated polyamide resin, and
      (3) 5 to 20 parts by weight of a copolymer of vinyl pyrrolidone and vinyl acetate;
   (d) 0.03 to 0.10% by weight of a thermal polymerization inhibitor;
   (e) 0 to 18% by weight of a plasticizer for the composition; and
   (f) 0 to 2% by weight of a tertiary amine capable of salt formation with a carboxylic acid, the percentages of the composition components being based on the total weight of the composition.

2. A photopolymerizable composition according to claim 1 wherein the monomeric compound is tetraethylene glycol diacrylate.

3. A photopolymerizable composition according to claim 1 or claim 2 wherein the initiator is an acetophenone compound.

4. A photopolymerizable composition according to claim 1 wherein binder system (C) is the reaction product of (1) terpolymer of methylmethacrylate (27 to 31%)/, butyl methacrylate (40 to 45%)/and methacrylic acid (26 to 32%); (2) amine-terminated polyamide resin 6 (81.3%)/66 (0.7%)/610 (18.0%) having a melting point of 145° to 150° C. or an amine-terminated polyamide resin 6 (5 to 10%)/66 (20 to 30%)/12 (60 to 70%) having a melting point of 120° to 130° C.; and (3) a copolymer of vinyl pyrrolidone (60%) and vinyl acetate (40%), all percentages being weight percentages.

5. A photopolymerizable composition according to claim 1 wherein the thermal polymerization inhibitor is 1,4,4-trimethyl-2,5-diazobicyclo[3.2.2]-non-2-ene-N,N'-dioxide.

6. A photopolymerizable composition according to claim 1 wherein a plasticizer is present.

7. A photopolymerizable composition according to claim 6 wherein the plasticizer is triphenyl phosphate.

8. A photopolymerizable composition according to claim 1 wherein a tertiary amine capable of salt formation with a carboxylic acid is present.

9. A photopolymerizable composition according to claim 8 wherein the tertiary amine is diethylcyclohexylamine.

10. A photopolymerizable element which comprises a support bearing a layer, 0.0005 to 0.250 inch (0.00127 to 0.635 cm) in thickness of the photopolymerizable composition according to claim 1.

11. A photopolymerizable element according to claim 10 wherein between the support and photopolymerizable layer is a layer of an adhesive composition.

12. A photopolymerizable element according to claim 10 wherein the support is a metal sheet.

13. A photopolymerizable element which comprises a support bearing an extruded layer 0.010 to 0.25 inch (0.254 to 6.35 mm) in thickness of the photopolymerizable composition according to claim 1.

* * * * *